United States Patent [19]

Lee

[11] Patent Number: 4,851,713

[45] Date of Patent: Jul. 25, 1989

[54] FAST CMOS NAND GATE CIRCUIT

[75] Inventor: Sywe-Neng Lee, Boston, Mass.

[73] Assignee: GTE Laboratories Incorporated, Waltham, Mass.

[21] Appl. No.: 166,576

[22] Filed: Mar. 10, 1988

[51] Int. Cl.$^4$ .................... H03K 17/16; H03K 19/017; H03K 19/094

[52] U.S. Cl. .................... 307/443; 307/448; 307/451

[58] Field of Search .................... 307/443, 448, 451

[56] References Cited

U.S. PATENT DOCUMENTS 4,736,117  4/1988  Wieser .................... 307/451

OTHER PUBLICATIONS

"High-Speed Compact Circuits with CMOS" IEEE Journal of Solid State Circuits, vol. SC-17, No. 3, Jun. 1982, Krambeck et al.

Primary Examiner—Stanley D. Miller
Assistant Examiner—M. K. Wambach
Attorney, Agent, or Firm—James J. Cannon, Jr.; David M. Keay

[57] ABSTRACT

An n-input CMOS NAND-gate having n pMOS transistors connected in parallel with their inputs connected to different input terminals and their outputs connected to a common output terminal. First and second sets of n nMOS transistors are each connected in series between the output terminal and ground. The inputs of the first set of nMOS transistors are connected to the input terminals in order, and the inputs of the second set of nMOS transistors are connected to the input terminals in the reverse order.

3 Claims, 2 Drawing Sheets

FAST CMOS NAND GATE CIRCUIT

CROSS-REFERENCE TO RELATED APPLICATION

This application is related to application Ser. No. (88-3-430) entitled Transistor Logic Circuit filed concurrently herewith by Sywe-Neng Lee and assigned to the assignee of the present application.

BACKGROUND OF THE INVENTION

This invention relates to logic circuits. More particularly, it is concerned with logic circuits employing complementary transistors.

Basic logic gates are used extensively in logic circuit design to implement the Boolean Algebra of either combination logic or sequential circuits. Basic logic circuits frequently employ complementary metal-oxide-semiconductor (CMOS) transistors. One widely-used logic gate circuit is the so-called NAND-gate. With previously known CMOS NAND-gates the speed of switching between operating states increases with the number of inputs to the gate. This gate delay becomes significant when the number of inputs to the gate is greater than five. For instance, when a NAND-gate is used as a decoding element of the control section in high speed signal processing and high speed switching applications, the gate delay will affect the entire system throughput becoming a dominant factor in determining the system performance.

One approach for improving the speed-degrading problem of gate delay is to separate the NAND-gate into several NAND-gates, each having only a few inputs, and connecting the outputs of the several NAND-gates to an OR-gate. Such an arrangement, however, increases the number of stages of delay from one to three; the NAND-gates, a NOR-gate, and an inverter. Another approach is to increase the size of the MOS transistors in order to increase both the charging and the discharging speeds at the output of the gate. Increasing the size of a transistor beyond a certain amount, however, increases the source-drain and the gate capacitances of the transistor thus degrading the charging and discharging speed.

SUMMARY OF THE INVENTION

A logic circuit in accordance with the present invention comprises a plurality of input terminals for receiving input signals at a first or a second logic level, and an output terminal. A like plurality of transistors of one conductivity type are connected in parallel between a source of operating potential and the output terminal. Each transistor has an input connected to one of the input terminals. A first set of a like plurality of transistors of the opposite conductivity type are connected in order in series between the output terminal and a point of reference potential. Each of the transistors of the first set has an input connected to one of the input terminals in order. A second set of a like plurality of transistors of the opposite conductivity type are connected in order in series between the output terminal and the point of reference potential. Each of the transistors of the second set has an input connected to one of the input terminals in a different order from the transistors of the first set.

For a better understanding of the present invention, together with other and further objects, advantages, and capabilities thereof, reference is made to the following disclosure and appended claims in connection with the above-described drawings.

DETAILED DESCRIPTION

Figure 1:
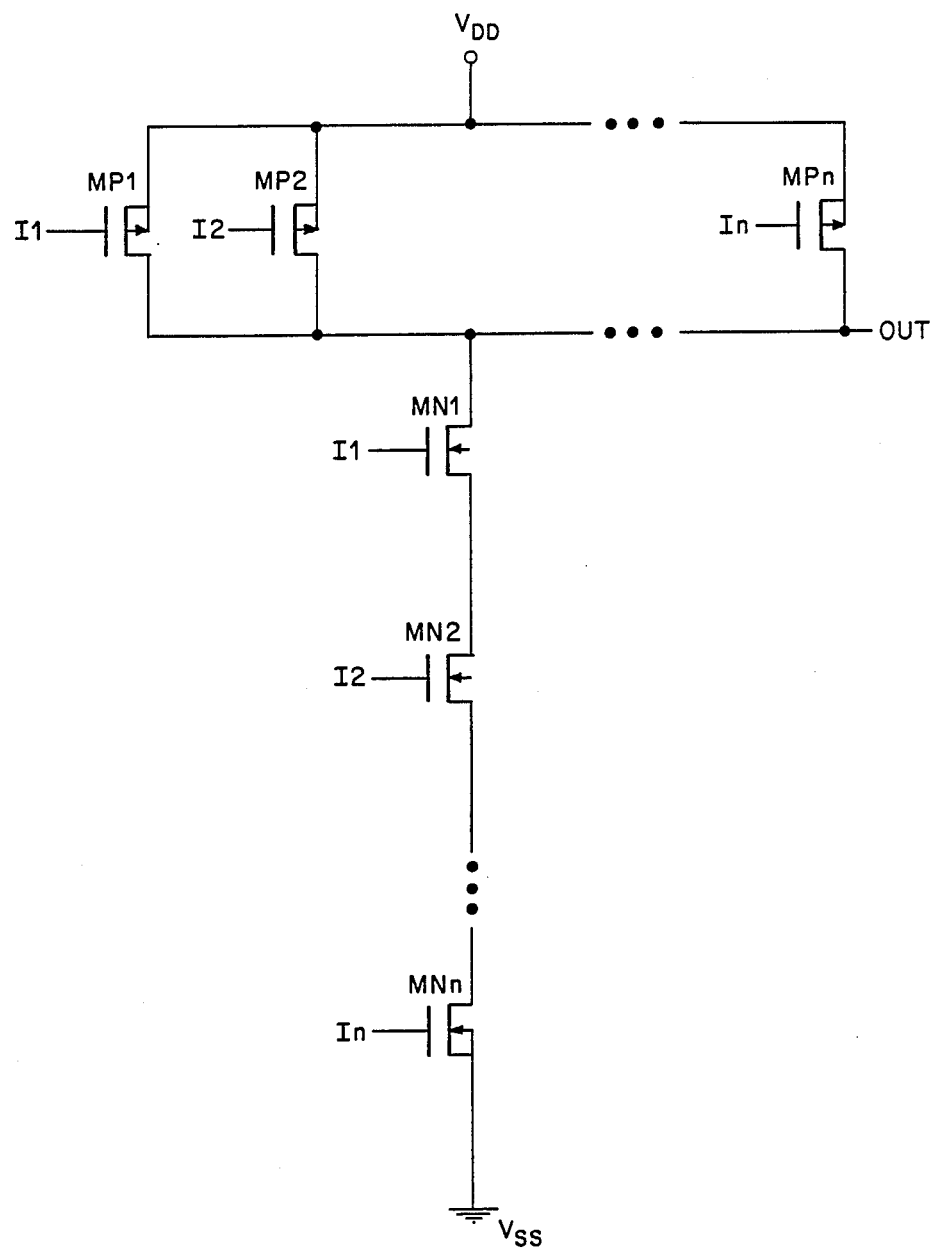
FIG. 1 is a schematic circuit diagram of a CMOS NAND-gate of the prior art.

FIG. 1 is a schematic circuit diagram of a conventional, prior art CMOS NAND-gate. As is well understood, a NAND-gate operates to produce a logic 0 at its output OUT when and only when a logic 1 is present at all of the inputs I1-In. The CMOS NAND-gate as illustrated in FIG. 1 includes a plurality of n pMOS transistors MP1-MPn connected in parallel between a source of positive operating voltage $V_{DD}$ and an output terminal OUT. The gate of each pMOS transistor is connected to a different input terminal I1-In. A like plurality of n complementary nMOS transistors MN1-MNn are connected in series between the output terminal OUT and a point of reference potential $V_{SS}$ indicated as ground. The nMOS transistors MN1-MNn have their gates connected to the input terminals I1-In in order. Thus, each input terminal I1-In is connected to the gates of a pair of CMOS transistors MP1-MPn, and MN1-MNn, respectively.

The CMOS NAND-gate of FIG. 1 operates in the following manner. Whenever one or more of the input signals at the input terminals I1-In is low, logic 0, the pMOS transistor, or transistors, MP1-MPn having that signal at the input is conducting or turned on. The complementary nMOS transistor MN1-MNn connected to the same input terminal is nonconducting or off. Under these conditions the potential at the output terminal OUT is approximately that of the source of operating potential $V_{DD}$.

When the input signals at all of the input terminals I1-In are high, logic 1, all of the pMOS transistors MP1-MPn are nonconducting or off producing a high impedance between the voltage source $V_{DD}$ and the output terminal OUT. All of the nMOS transistors MN1-MNn are on or conducting and thus the potential at the output terminal OUT is approximatel $V_{SS}$.

The "worst case" delay situation occurs when the input signals to the input terminals I1-In-1 are high, logic 1, and the input to the other input terminal In changes from low, logic 0, to high, logic 1. While the input signals at input terminals I1-In-1 are high and the input signal at input terminal In is low, transistors MP1-MPn-1 are off and transistor MPn is on, transistors MN1-MNn-1 are on and transistor MNn is off. Under these conditions the output terminal OUT is charged through the conducting transistor MPn to approximately $V_{DD}$. The source-drain regions of the on nMOS transistors MN1-MNn-1 are also charged to $V_{DD}$.

When the input signal at input terminal In changes from low, logic 0, to high, logic 1, transistor MPn turns off and transistor MNn turns on. In order for the potential at the output terminal OUT to change to the potential $V_{SS}$, all of the charges previously stored at the output terminal node as well as the charges stored in the source-drain regions of the nMOS transistors MN1-MNn-1 must be removed. The discharge path for these charges is through transistor MNn, now conducting, to $V_{SS}$. The charge stored at the output terminal node must wait until all of the source-drain regions of transistors Mn1-MNn-1 have been discharged, and in addition the stored charge must pass through all of the nMOS transistors MN1-MNn in series. Thus, it can be seen that the discharge time or gate delay for a gate degrades rapidly as the number of inputs and consequently the number of transistors in the discharge path increases.

Figure 2:
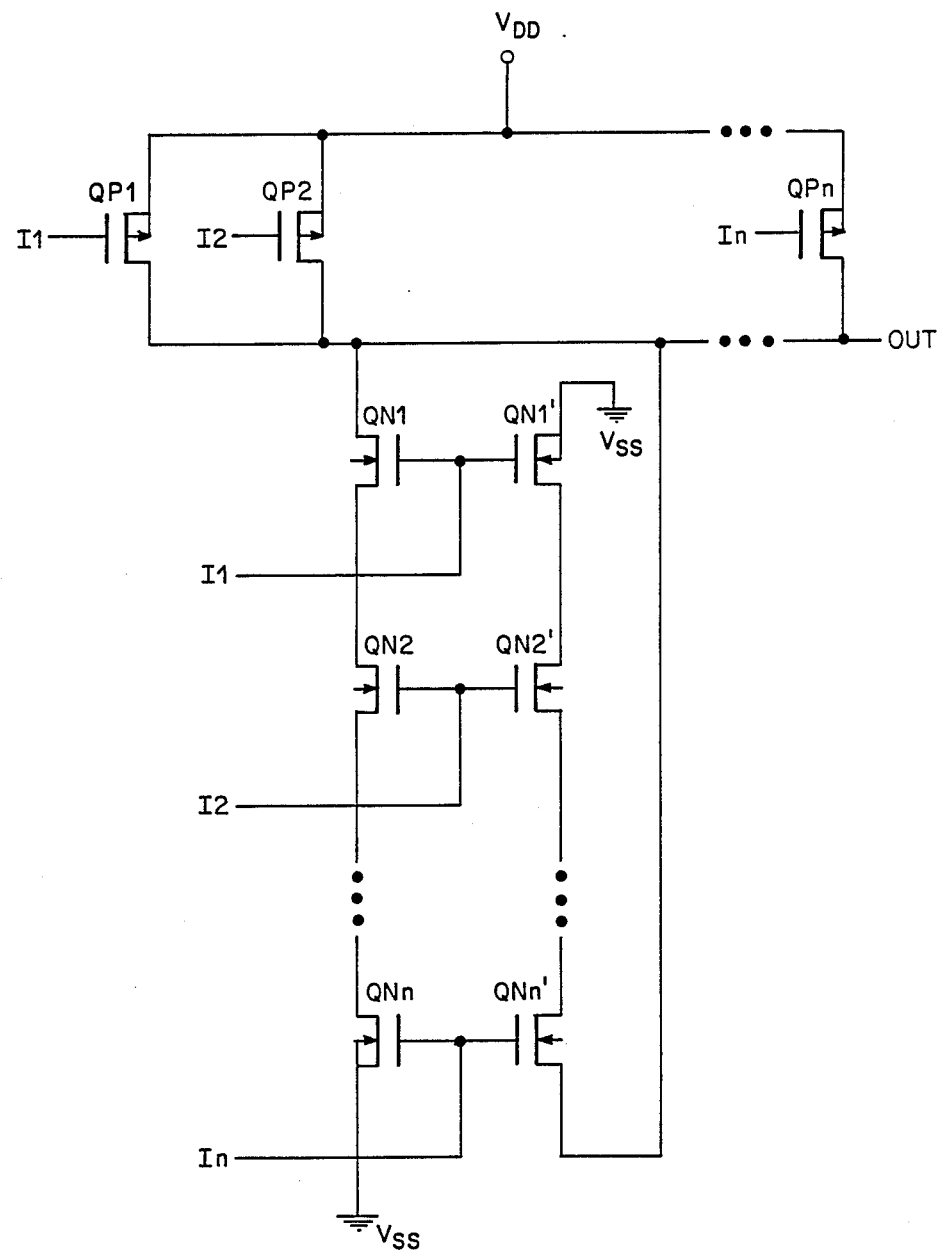
FIG. 2 is a schematic circuit diagram of a CMOS NAND-gate in accordance with the present invention.

FIG. 2 illustrates an improved CMOS NAND-gate in accordance with the present invention. The circuit includes a plurality n of pMOS transistors QP1-QPn connected in parallel between a source of positive operating potential $V_{DD}$ and an output terminal OUT. The gate of each pMOS transistor QP1-QPn is connected to a different input terminal I1-In. The circuit also includes a first set of a like plurality n of nMOS transistors QN1-QNn connected in series between the output terminal OUT and ground, $V_{SS}$. Each of the first set of nMOS transistors QN1-QNn has its input electrode connected in order to an input terminal I1-In to form pairs of complementary transistors with the pMOS transistors QP1-QPn.

The circuit of FIG. 2 also includes a second set of a like plurality n of nMOS transistors QN1'-QNn' connected in series between the point of reference potential $V_{SS}$ and the output terminal OUT. Alternatively, the transistors QN1'-QNn' of the second set may be considered as connected in reverse order between the output terminal OUT and the reference voltage $V_{SS}$. The inputs of the nMOS transistors QN1'-QNn' of the second set are connected in order to the input terminals I1-In; or if considered in the reverse order from the output terminal OUT to $V_{SS}$, the inputs are connected to the input terminals in reverse order.

Thus, in the "worst case" situation as discussed hereinabove with respect to the circuit of FIG. 1, when the input signals at input terminals I1-In-1 are high, logic 1, and the input signal at input terminal In is low, logic 0, pMOS transistors QP1-QPn-1 are off and pMOS transistor QPn is on. In addition, nMOS transistors QN1-QNn-1 of the first set and nMOS transistor QN1'-QNn-1' of the second set are on and nMOS transistors QNn and QNn' are off. The potential at the output terminal OUT is approximately $V_{DD}$ and the source-drain regions of the on nMOS transistors QN1-QNn-1 of the first set are also charged to $V_{DD}$. In the second set of nMOS transistors, transistor QNn' is off and transistors QN1'-QNn-1' are biased on. Thus the source-drain regions of transistors QN1'-QNn-1' are already at the $V_{SS}$ level. Therefore, when the input signal at the input terminal In changes from low, logic 0, to high, logic 1, turning pMOS transistor QPn off and turning nMOS transistors QNn and QNn' on, the charge stored at the output terminal node is discharged to $V_{SS}$ through only a single transistor QNn'. There are no charges stored in the source-drain regions of transistors QN1'-QNn-1' which must be removed. The stored charge at the output node is thus discharged to $V_{SS}$ more rapidly than in prior art circuits, thereby providing significantly improved gate delay characteristics particularly for logic gates with a large number of inputs.

While there has been shown and described what is considered a preferred embodiment of the present invention, it will be obvious to those skilled in the art that various changes and modifications may be made therein without departing from the invention as defined by the appended claims.

What is claimed is:

1. A logic circuit comprising
   a plurality of input terminals for receiving input signals at a first or a second logic level;
   an output terminal;
   a like plurality of transistors of a first conductivity type connected in parallel between a source of operating potential and said output terminal, and each having an input connected to one of said input terminals;
   a first set of a like plurality of transistors of a second conductivity type connected in series between said output terminal and a point of reference potential, each having an input connected to one of said input terminals; and
   a second set of a like plurality of transistors of said second conductivity type connected in series between said output terminal and said point of reference potential, each having an input connected to one of said input terminals such that each transistor in said first set is paired with a transistor in said second set having a like position in said series and both are connected to the same one of said input terminals;
   wherein the last transistor in said series of transistors of said first set is connected to ground; and
   wherein the first transistor in said series of transistors of said second set is connected to ground;
   wherein said first conductivity type is opposite to said second conductivity type; and
   wherein each transistor of said first conductivity type is in a conducting condition in response to an input signal of said first logic level at its input and is in a nonconducting condition in response to an input signal of said second logic level at its input; and
   each transistor of said second conductivity type is in a nonconducting condition in response to an output signal of said first logic level at its input and is in a conducting condition in response to an input signal of said second logic level at its input; whereby said output terminal is at the potential of the source of operating potential when input signals of the first logic level are present at one or more of the input terminals, and said output terminal is at the potential of the point of reference potential when input signals of the second logic level are present at all of the input terminals.

2. A logic circuit in accordance with claim 1 wherein said transistors of said first conductivity type are P-type; and
   said transistors of said second conductivity type are N-type.

3. A logic circuit in accordance with claim 1 wherein said transistors of the first conductivity type are pMOS transistors;
   said transistors of the second conductivity type are nMOS transistors; and
   said source of operating potential is positive with respect to said point of reference potential.

* * * * *